United States Patent [19]
Pun et al.

[11] Patent Number: 5,650,736
[45] Date of Patent: *Jul. 22, 1997

[54] SLEW RATE CONTROLLER FOR HIGH SPEED BUS

[75] Inventors: Philip Y. Pun, Sunnyvale; William A. Stutz, San Jose, both of Calif.

[73] Assignee: Advanced Micro Devices, Inc., Sunnyvale, Calif.

[*] Notice: The term of this patent shall not extend beyond the expiration date of Pat. No. 5,479,124.

[21] Appl. No.: 467,043

[22] Filed: Jun. 6, 1995

Related U.S. Application Data

[63] Continuation of Ser. No. 109,796, Aug. 20, 1993, Pat. No. 5,479,124.

[51] Int. Cl.[6] .................................................. H03K 5/12
[52] U.S. Cl. ............................ 327/170; 327/108; 327/306
[58] Field of Search ................................... 327/108, 170, 327/306

[56] References Cited

U.S. PATENT DOCUMENTS

| | | | |
|---|---|---|---|
| 4,653,079 | 3/1987 | Allen | 307/261 |
| 4,859,870 | 8/1989 | Wong et al. | 307/263 |
| 5,111,076 | 5/1992 | Tarng | 307/446 |
| 5,153,450 | 10/1992 | Ruetz | 307/270 |
| 5,331,217 | 7/1994 | Mellissinos | 307/260 |
| 5,479,124 | 12/1995 | Pun et al. | 327/108 |

OTHER PUBLICATIONS

Price, Semiconductor Memories—A handbook of Design, Manufacture, and Application, Second Edition, Chapter 8, "Trends in Static RAMs" (3 pages).

Wada et al., Simple Noise Model and Low–Noise Data–Output Buffer for Ultrahigh–Speed Memories, IEEE J. of Solid–State Circuits, vol. 25, No. 6, Dec. 1990.

Gubbels et al., A 40–ns/100–pF Low–Power Full–CMOS 256k (32KX8) SRAM, IEEE J. of Solid–State Circuits, vol. SC–22, No. 5, Oct. 1987.

*Primary Examiner*—Margaret Rose Wambach
*Attorney, Agent, or Firm*—Townsend and Townsend and Crew, LLP

[57] ABSTRACT

A technique for high speed transmission of digital signals on a bus line with reduced signal ringing, bounce and bus contention current. The approach uses a multi-partitioned driver design with temporary and steady state parts incorporating internal feedback and delay techniques to control the output slew rate. A built-in function outputs the driving status of the transceiver and allows the output to enter the high impedance status asynchronously.

9 Claims, 6 Drawing Sheets

SLEW RATE CONTROLLER FOR HIGH SPEED BUS

This is a continuation of application Ser. No. 08/109,796 now U.S. Pat. No. 5,479,124 filed Aug. 20, 1993.

BACKGROUND OF THE INVENTION

This invention relates generally to integrated circuits and more specifically to communications between two or more data processing circuits over a transmission line.

FIG. 1 shows a prior art part of a microprocessor system that would be a typical application for the invention. The system contains a microprocessor 1, connected to a numerical processor 3 by a plurality of bus lines 4. Microprocessor 1 includes a plurality of transceiver circuits 5 for transmission of signals on bus lines 4. Numerical processor 3 includes a plurality of transceiver circuits 6 also for transmission of signals on bus lines 4. Transceiver circuits 5 and 6 act as interfaces between the bus lines and the other circuitry of microprocessor 1 and numerical processor 3. A clock circuit 10 generates a system clock signal which is decoded on each chip into non-overlapping clock signals PHA and PHB that are used to clock all data transfers on bus lines 4. While FIG. 1 illustrates transceivers (5) built according to the invention communicating with other transceivers (6) built according to the invention, the invention is not limited to such applications. Transceivers built according to the present invention may be used to communicate with devices incorporating a variety of different bus interface circuitry, including asychronous devices not utilizing a shared system clock for data transfer.

In high performance microprocessors, a key factor limiting the overall speed of the system is the speed with which data signals can be sent over signal lines such as bus lines 4. The speed of data transmission over such lines in prior art systems have been generally limited by the electrical characteristics of the lines and of the driving circuits that drive the lines. In general, prior art systems have had to make a trade-off between transmission speed, power, and noise, i.e. the faster the prior art circuits attempted to transmit data on the lines, the more electrical noise was generated on the lines and on the power supplies of the driver circuit system.

In order to understand the nature of this trade-off, consider first FIG. 2A, which is a diagram of an idealized data signal on a bus line. This idealized representation of a digital data signal is a perfect "square wave" where the voltage on the line changes instantaneously from $V_{ss}$ (ground) to $V_{dd}$ when the information transmitted on the line changes from logical 0 to logical 1 and changes instantaneously from $V_{dd}$ to $V_{ss}$ when the information changes from 1 to 0. When a circuit wants to send a logical 0 ($V_{ss}$) signal on the bus line, it must "pull down" the bus line to $V_{ss}$ and must "sink" sufficient current to pull down and hold the line at $V_{ss}$ for the duration of a data transfer cycle. When a circuit wants to send a logical 1 ($V_{dd}$) signal on the bus line, it must "pull up" the bus line to $V_{dd}$ and must "source" sufficient current to pull up and hold the line at $V_{dd}$ for the duration of a data transfer cycle.

Now consider FIG. 2B, which illustrates a timing diagram of a typical real-world digital data signal on a bus line. In real-world circuits, it takes a finite amount of time for a bus driver circuit to move the voltage from $V_{ss}$ to $V_{dd}$ or vice versa. This amount of time is referred to as the rise time of the data signal, and the rate of change of the voltage on the line (dv/dt) is referred to as the slew rate. The duration of this rise time is determined by the driving characteristics of the electrical driver circuit putting data on the bus and by the electrical load (capacitance, inductance, and resistance) characteristics of the bus transmission line and of the circuit receiving the signal. FIG. 2B illustrates another respect in which a real-world digital bus signal varies from the idealized signal shown in FIG. 2A: bounce. Bounce is the result of the inductances inherent in real-world circuits and transmission lines. Bounce occurs on the transition from $V_{dd}$ to $V_{ss}$ and is characterized by the voltage on the bus line bouncing about $V_{ss}$ and then decaying exponentially to zero. Bounce also occurs on the transition from $V_{ss}$ to $V_{dd}$ where it is characterized by the voltage on the bus line bouncing about $V_{dd}$ and then decaying exponentially to $V_{dd}$. Bounce creates high frequency noise on the bus line and in the power source and this noise can seriously degrade overall system performance. As indicated above, the amount of bounce is in part a function of the slew rate of the circuit in that the faster the slew rate, the more the signal on the line bounces.

FIG. 2B shows in detail the effects of slew time and bounce on the voltage level appearing on the transmission line. At a time $t_0$, a driving circuit begins to put a logical 0 data signal on the bus line by lowering the voltage level to $V_{ss}$. (Prior to time $t_0$ the driving circuit is in an off or high-impedance state and the voltage on the line is at $V_{dd}$.) Because it takes time for the driving circuit to sink current from the line in order to lower the voltage level, the voltage level does not reach $V_{ss}$ until a time $t_1$. The interval $t_{rt}$ from time $t_0$ to $t_1$ is the rise time of the circuit and the slope of the voltage change during that rise time is the slew rate.

After time $t_1$, the voltage on the line does not remain at $V_{ss}$ because of the interaction of the driving current and the inductance in the circuit. The voltage actually bounces about $V_{ss}$ and then decays towards $V_{ss}$ after time interval $t_b$. After time $t_b$, the voltage on the line becomes stable and the data may be read by a receiving circuit during time interval $t_v$. At a time $t_3$, the transmitting circuit begins to stop driving the data line. It takes the circuit a finite amount of time $t_{off}$ to completely stop driving the line and return to a high impedance state.

The duration of rise time $t_{rt}$ and the amount of bounce or ringing on the bus line generally act to limit the speed with which data may be transmitted on the bus line because the data cannot be read by the receiver until after the voltage on the bus line has risen or fallen to the proper level and has stabilized.

A third area of concern, in addition to bounce and slew rate, in high speed bus performance in real-world systems is bus contention. Bus contention occurs when two different bus users attempt to drive the bus to different logic levels at the same time. In a high speed bus, it is generally desired that new data be driven onto the bus as soon as the previous data is no longer being driven onto the bus. This means that at time $t_3$ in FIG. 2B, a new bus transmitter would begin driving the bus line. Contentions arise because it takes the first transmitter a finite time $t_{off}$ to turn off its transmission. If the new transmitter begins driving the bus line to $V_{dd}$ while the previous transmitter is still driving the bus at or near $V_{ss}$, a temporary short between $V_{dd}$ and $V_{ss}$ will result and can cause significant power drain and heat generation in the bus circuits.

Prior art bus driver circuits have reduced bounce generally by limiting the overall rate at which the circuits sink or source current on the bus line. While this strategy can effectively reduce bounce, it also slows down the data transmission rate on the bus because it increases the rise time of the bus. The increased transition time means that bus receivers must wait longer before latching data from the bus. Some prior art circuits have also attempted to reduce bounce by using feedback control from the external bus line to vary the rate at which current is sunk or sourced on the bus. This method has not worked well in some high speed microprocessor environments because the signal distortion and noise on the external bus line is so great that the feedback control cannot effectively control the rate of current sink or source on the bus.

It is therefore desired to fashion a bus driver circuit that minimizes bounce, without slowing down overall data transmission rates, and reduces bus contention.

SUMMARY OF THE INVENTION

The invention is a bus transceiver circuit and method that allow for very high speed transmission on a synchronous bidirectional digital data bus by controlling the slew rate and thereby minimizing ground bounce, noise, and power shorts due to bus contentions. The invention is designed to be incorporated into the circuitry of the separable integrated circuit components in a microprocessor system and acts as an interface between the data processing functions of the individual components and the data transmission functions between components.

The invention uses a unique combination of two active drivers: an AC driver and a DC driver. The AC driver drives the transmission line with current sufficient to change the voltage on the signal line and incorporates internal feedback slew rate control circuitry to achieve a reduced incidence of bounce. The DC driver drives the transmission line with the amount of current that is needed to maintain the voltage on the line, thereby minimizing short circuit current during bus contention. Finally, the invention uses STAT and SYNC signals to allow the data processing circuit to determine the state of the transceiver on power up and to reset asynchronously the transceiver to an off state. The result is a bus transceiver with low noise, reduced short circuit current due to bus contention, and high speed operation.

A further understanding of the nature and advantages of the invention may be realized by reference to the remaining portions of the Specification and the drawings.

DESCRIPTION OF THE PREFERRED EMBODIMENT

Transceiver Circuit Overview

Figure 1:
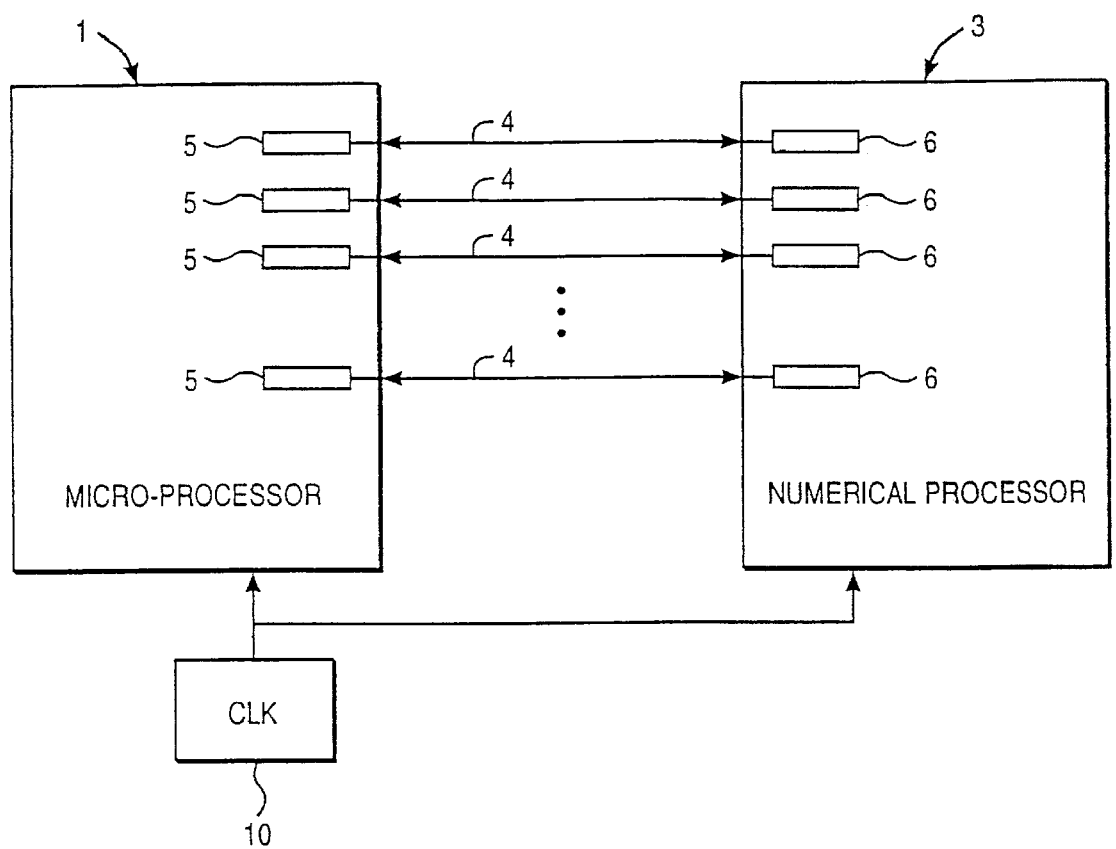
FIG. 1 is a block diagram of a microprocessor system incorporating the present invention.
Figure 2A:
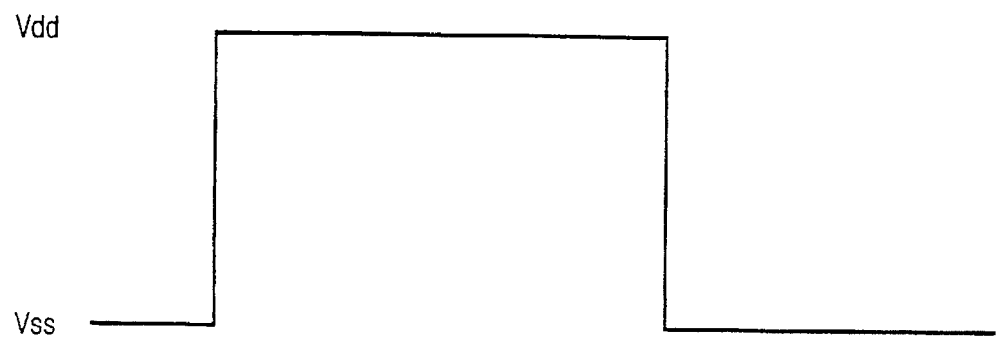
FIG. 2A is timing diagram of a idealized digital data signal.
Figure 2B:
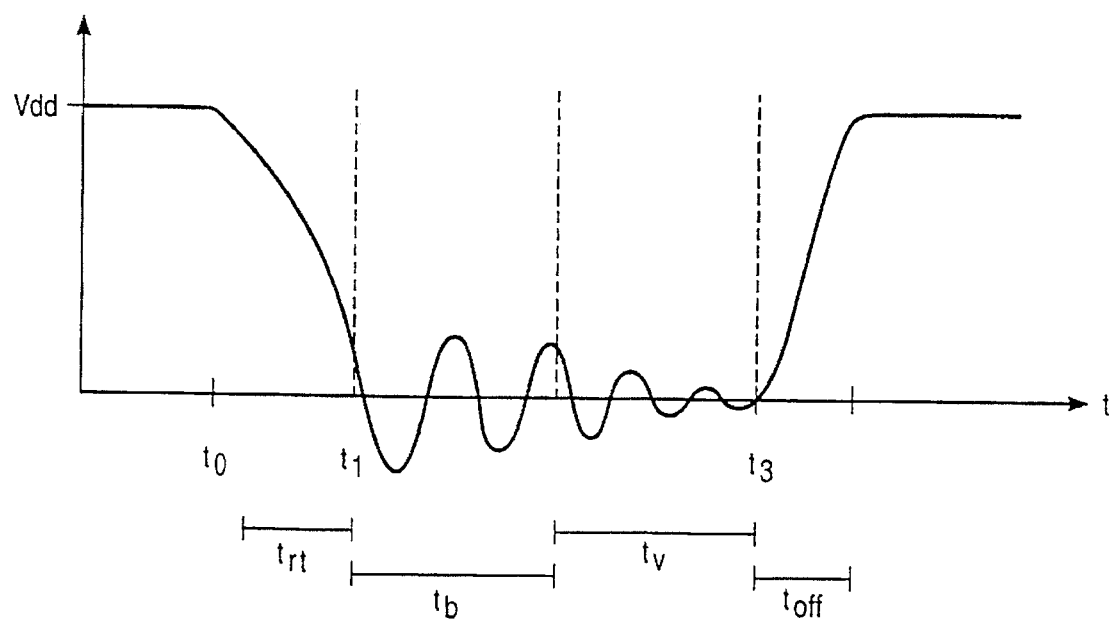
FIG. 2B is a timing diagram of a digital signal on a real-world transmission line.
Figure 3:
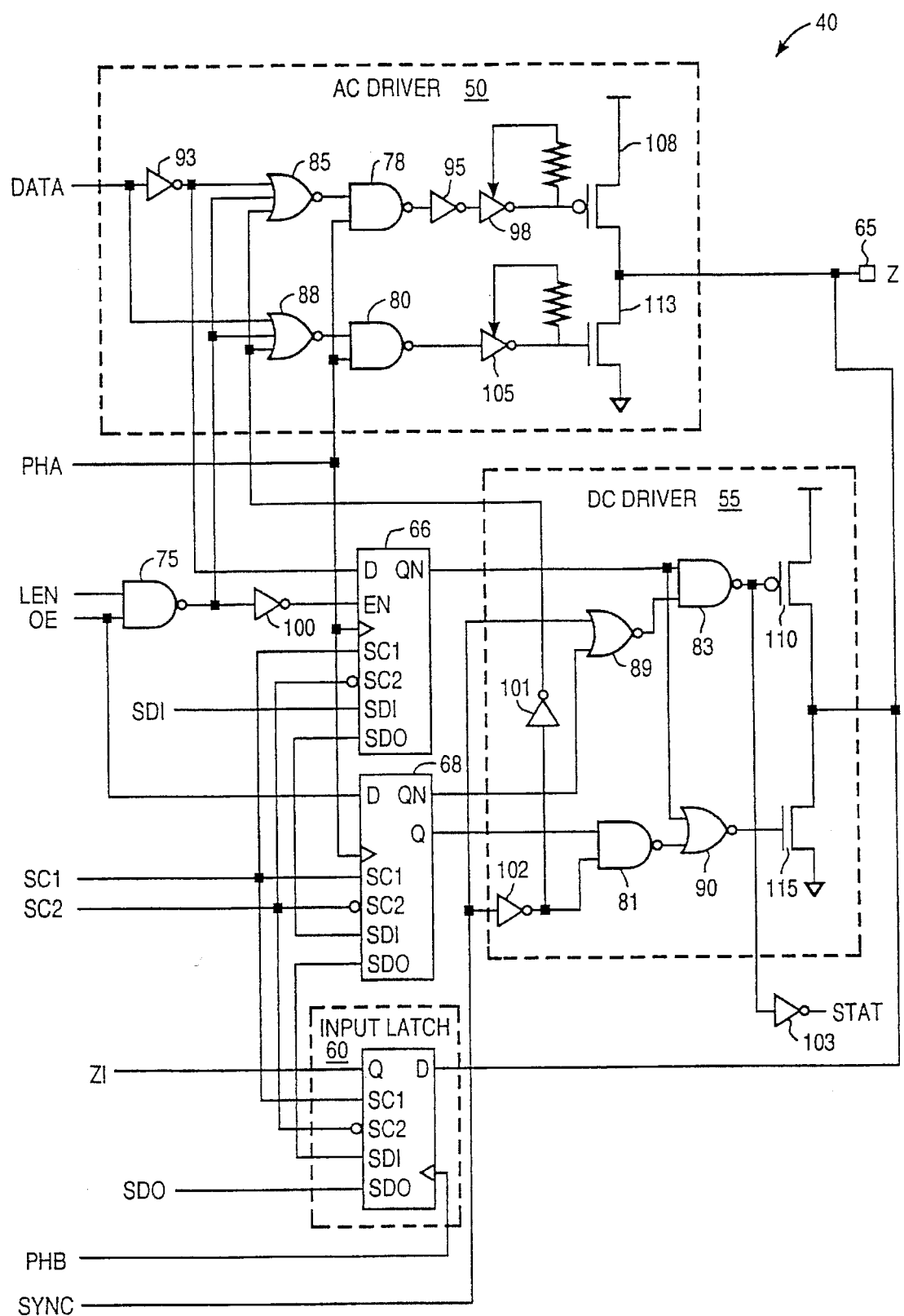
FIG. 3 is a circuit schematic of a bus transceiver circuit according to the present invention.

FIG. 3 is a logic level schematic of a bus transceiver 40 built according to the present invention. The transceiver communicates with other on-chip circuitry via a number of lines, the significance of which is as follows:

DATA - Data input pin (Input)

LEN - Latch enable pin (Input)

OE - Output enable pin (Input)

PHA - Phase A of internally generated clock signal (Input)

PHB - Phase B of internally generated clock signal (Input)

Z - Bidirectional pin connecting chip to external transmission line (Input/Output)

ZI - DATA signal from input latch to chip circuitry (Output)

SYNC - Asynchronous output disable pin (Input)

STAT - Output status (Output)

SDI - Scan data input (Input)

SDO - Scan data output (Output)

SC1 - Scan clock 1 (Input)

SC2 - Scan clock 2 (Input)

The circuit as illustrated in FIG. 3 includes three operational input/output components, indicated by the dashed lines in the figure: an AC driver 50, a DC driver 55, and an input latch 60. Each of these components is connected to a bidirectional bus pin Z (65). AC driver 50 and DC driver 55 handle data output from the data processing circuit to pin Z. Input latch 60 latches input signals on pin Z for input to the data processing circuit on signal line ZI.

A number of control and timing signals and associated circuit elements control the timing of the transceiver. The timing of DC driver 55 is controlled by a pair of latches 66 and 68. Latch 66 latches the DATA signal and latch 68 latches the OE signal so that these signals will be available as input to DC driver 55 for the duration of an output cycle. The circuit also contains a number of logic gates (NAND gates 75, 78, 80, 81, and 83, NOR gates 85, 88, 89, and 90, and buffers 93, 95, 98, 100, 101, 102, 103 and 105), which operate to combine timing signals to control timing and operation of the transceiver.

AC driver 50 and DC driver 55 drive signals on the bus line through pin Z by means of 4 large transistors, 108, 110, 113, and 115. Transistors 108 and 110 are p-channel transistors that act as pull up transistors for the drivers and turn on in order to transmit $V_{dd}$ on the Z pin. Transistors 113, and 115 are n-channel transistors that act as pull down transistors for the drivers and turn on to transmit $V_{ss}$ on the Z pin. All four of the transistors are off when the transceiver is in a high impedance state. (While devices 108, 110, 113 and 115 are shown in FIG. 3 as single transistors for the sake of simplicity in this figure, they are in fact constructed from a number of enhancement mode metal-oxide semiconductor field effect transistors (MOSFETs) as described below and illustrated in FIGS. 5 and 6.)

The operation of latches 60, 66, and 68 will now be described. Each of latches 60, 66, and 68 has a clock input (indicated by the > symbol), a data input pin D, and either a data output pin Q, an inverse data output pin QN, or both. Each of the latches also has four "scan" pins (SC1, SC2, SDI, SDO) which are used exclusively for scan testing in accordance with published standards and form no part of the invention nor of the normal operation of the transceiver in sending and receiving data. All three latches (60, 66, 68) are transparent latches meaning that while the clock input is high, the Q output will follow the D input with the exception of latch 66 which in addition requires its enable pin EN to be set to high. When the clock or enable pin is set to low, the output will be latched at the level of the data that was set up at the D input.

Bus Timing

Figure 4:
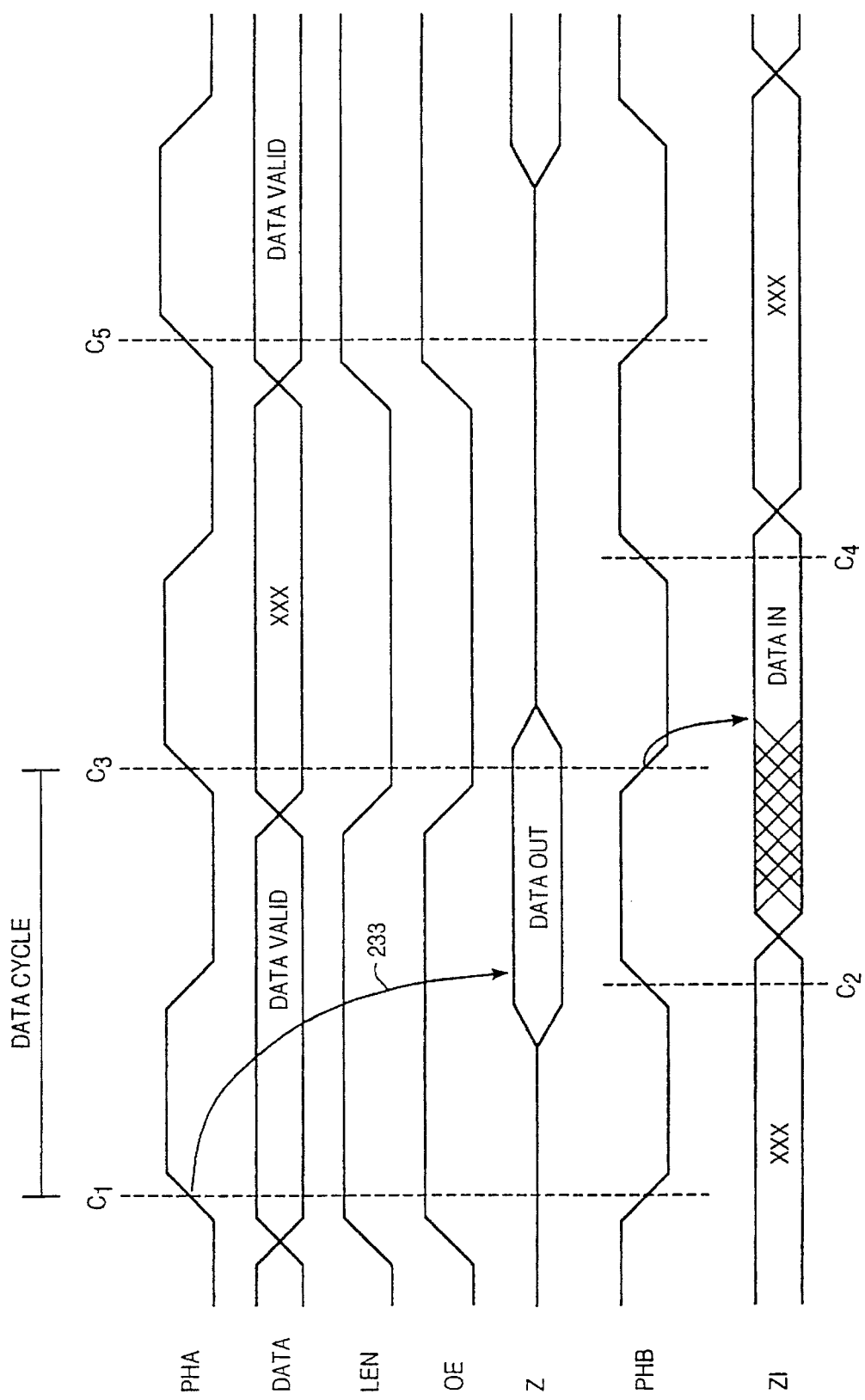
FIG. 4 is a timing diagram of bus data transmission in a microprocessor system incorporating the present invention.

FIG. 4 is a diagram showing the timing of the data and control signals of the transceiver shown in FIG. 3. The timing of events on the chip is relative to the two clock signals PHA and PHB. As described above, PHA and PHB are two internally generated clock signals having duty cycles of approximately 50% and being approximately 180° out of phase with each other.

A single data transfer takes place within one data cycle, which begins at a rising edge of PHA ($c_1$) and ends at the next rising edge of PHA ($c_3$). An on-chip circuit wishing to transmit a bit of data on the external line connected to pin Z drives new data to the DATA line and sets OE and LEN high during the low phase of PHA prior to the rising edge of PHA. The transceivers will begin driving the data on pin Z at the beginning of the next data cycle, which occurs when PHA goes high at time $c_1$. The transceivers will continue to drive the bus lines with the data until the next rising edge of PHA which occurs at time $c_3$ and which defines the end of the data cycle. The signals DATA, OE and LEN must be held valid after $c_1$ until they are latched by latches 66 and 68 at the next falling edge of PHA, which occurs at time $c_2$.

After time $c_1$, there is a delay (indicated by arrow 233) until the Z signal on the bus output pin becomes valid and stable. This delay is caused by the propagation delay of the transceiver, the rise time of the bus, and bounce as described above. In order to allow the bus signal the maximum possible time to reach the proper voltage and become valid, the data is not latched by the input latches (such as 60) of the receiving circuits until the end of the data cycle, which occurs simultaneously with the falling edge of PHB at time $c_3$.

AC/DC Driver Timing

The circuit is designed to operate in such a way that AC driver 50 drives pin Z only during the first part of an output cycle. During the second part of the output cycle, after AC driver 50 turns off, DC driver 55 is responsible for maintaining the voltage on pin Z until the end of the output cycle.

In part, the benefits of the invention stem simply from the use of two driver circuits at the beginning of an output cycle and one at the end. Use of two drivers at the beginning of the cycle provides the extra sink or source current needed to change the voltage on the transmission line. Use of just one driver during the last half of the cycle reduces the short circuit current drain that can result from bus contention.

In addition, this two-part driver design allows the AC and DC drivers to be optimized to perform the different voltage transitions necessary during the two different parts of the output cycle. AC driver 50 is optimized to "turn on" quickly, i.e., it drives the bus line with the large amount of current needed to change the voltage on the line quickly and it incorporates internal feed-back slew control circuitry, described below, to minimize the bounce that is associated with a fast rise time. DC driver 55 is optimized to maintain the voltage and "turn off" quickly, i.e., it drives the line with the current needed to maintain the voltage and shuts off quickly when the transceiver goes to a high impedance state.

This quick turn-off aspect of the DC driver design minimizes the time during which bus contentions can occur. The lower current present from the DC driver alone at the end of the cycle minimizes the current drain and heat generation effect of bus contentions that do occur because less current will flow during a bus contention. The lower power of the DC driver compared to the combined AC/DC drivers also minimizes the effect that bus contention has in slowing down the rise time of the next transmitting transceiver when two transceivers built according to the invention are used to transmit signals on a bus line, because the combined AC driver and DC driver of the other transceiver can easily "win" a bus contention with a single DC driver and can begin to drive the line to the new voltage despite the presence of some bus contention from the DC driver.

The operation and timing of the AC/DC driver output and input will now be described. Following that description, the internal structure and operation of the AC and DC driver transistors 108, 110, 113, and 115 will be described.

Referring back to FIG. 3, the AC/DC driver output of the transceiver works as follows. When the data processing circuit asserts valid data on the DATA line and raises the signals OE and LEN in order to transmit data, the AC and DC drivers each become ready to drive the Z pin on the next rising edge of PHA. In the AC driver, OE, LEN and PHA are combined with the DATA signal by logic gates 75, 93, 85, 88, 78, and 80 such that when OE, LEN, and PHA are all true (high) then either transistor 108 or 113 is turned on according to the logic level of the DATA pin: if DATA is high, transistor 108 is turned on, connecting Z pin 65 to $V_{dd}$ and thereby driving the Z pin high; if DATA is low, transistor 113 is turned on connecting Z pin 65 to ground and thereby driving the Z pin to low. The selected transistor remains on until PHA changes to low during the second part of the cycle at which time the selected transistor turns off and the AC driver of the transceiver stops driving the Z pin.

In the DC driver, OE, LEN, PHA, and the DATA signal are also inputs to latches 66 and 68. So long as PHA is high, latches 66 and 68 are transparent, and logic gates 75, 100, 81, 83, 89, and 90 combine OE, LEN, PHA, and the DATA signal such that when OE and LEN are true then either transistor 110 or 115 is turned on according to the logic level of the DATA pin: if DATA is high, transistor 110 is turned on, connecting Z pin 65 to $V_{dd}$ and thereby driving the Z pin high; if DATA is low, transistor 115 is turned on connecting Z pin 65 to ground and thereby driving the Z pin to low. During the high phase of PHA, both the AC and DC driver circuits drive the Z pin. When PHA goes low, latches 66 and 68 latch the data on their D inputs and maintain their outputs Q and QN. These latch outputs are maintained for the duration of the output cycle and in turn cause the selected DC driver transistor to continue driving pin Z until the end of the output cycle. When the PHA signal goes high again at the beginning of the next data cycle, the outputs of latches 66 and 68 again become transparent and the DC driver is either turned off or changes the data it is driving on pin Z in response to the new LEN and OE and DATA signals.

Transceiver Setting on Power-Up

The output of NAND gate 83 is provided to a STAT signal line through buffer 103. This STAT signal line is used along with the SYNC signal to prevent multiple transceivers from driving the bus line during power up and causing a power short. During system power up, the initial state of the transceiver is unknown. If the transceiver outputs are active for a short period of time during power up, but prior to system initialization, it is possible that bus contention among the transceivers between the microprocessor chip and the supporting chips may prevent the system from powering up properly.

The on-chip circuit can sample the STAT pin to see if the transceiver is actively driving the bus line. If the data processing circuit detects that the transceiver is actively driving the line, it can asynchronously send a SYNC signal to shut it off.

Operation of Line-Driver Transistors

Figure 5:
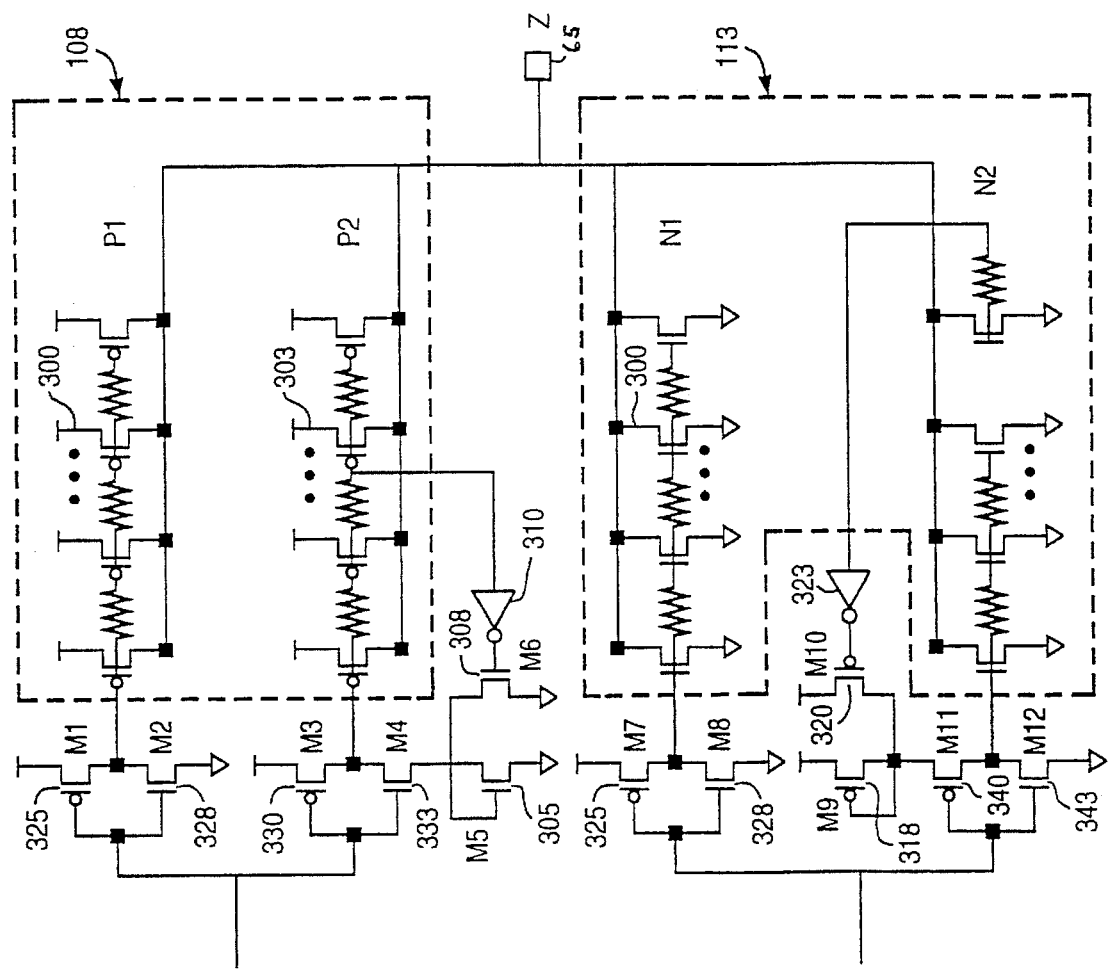
FIG. 5 is a circuit schematic of pull up device 108 and pull down device 113 of AC driver circuit 50 according to the invention.

FIG. 5 is a circuit diagram of pull up device 108 and pull down device 113 of the AC driver circuit with associated buffers 98 and 105. While these devices are shown as individual transistors in FIG. 3, as can be seen in FIG. 5, they are actually constructed from a number of discrete transistors.

Transistor banks P1 and P2 make up pull up device 108. Switching transistors M1 through M6 and invertor 310 make up inverting buffer 98. Transistor banks N1 and N2 make up pull down device 113. Switching transistors M7 through M12 and inverter 323 make up inverting buffer 105.

Pull up device 108 and pull down device 113 operate in an identical fashion during an output cycle, the only difference being that device 108 handles AC output driving during a $V_{dd}$ (logic 1) output and device 113 handles AC output driving during a $V_{ss}$ (logic 0) output. The detailed operation of device 108 will now be explained.

At the start of an output cycle in which a logic 1 is being transmitted, $V_{dd}$ is transmitted to the gates of M1, M2, M3, and M4 by buffer 95, turning off M1 and M3 and turning on M2 and M4.

When M2 turns on, the P1 transistor bank begins to turn on fully to initiate the low to high transition on output pin Z. The gates of the P1 transistors are connected sequentially to allow for the transistors to turn on one after another rather than all at the same time. This helps to keep the change in current small and provides one means of slew rate control.

The P2 bank does not turn on fully when M4 turns on because of the limiting actions of transistors M5 and M6. When M4 turns on, transistor M5 and M6 are initially off. This limits the gate voltage of output transistor bank P2 to one threshold voltage drop from the ground reference, thereby preventing P2 from fully turning on. M5 and M6 remain off until the feedback signal to inverter 310 reaches the inverter switching threshold. The voltage feedback signal is taken from somewhere in the middle of the sequential connections of transistor bank P2. The feedback tap is located such that invertor 310 turns on when the voltage on the Z pin reaches $V_{dd}/2$. Once the signal feedback to inverter 310 reaches the inverter's switching threshold, transistor M6, which is a long channeled NMOS transistor, slowly discharges the gate charge of transistor bank P2 thereby slowly turning on P2 fully. The transistors are designed so that P2 is finally fully on just near the end of the transition to voltage $V_{dd}$ on pin Z. Transistor banks P1 and P2 then remain on until a high to low transition on PHA forces the gate signal at M2 and M4 low, shutting off P1 and P2.

Pull-down transistor 113 operates in an identical fashion with the exception of the location of the feedback path through invertor 323. In transistor 113, the feedback is tapped at the very last stage of the sequentially gate transistors. This reflects the faster propagation of the $V_{ss}$ signal in the pull-down transistor.

Figure 6:
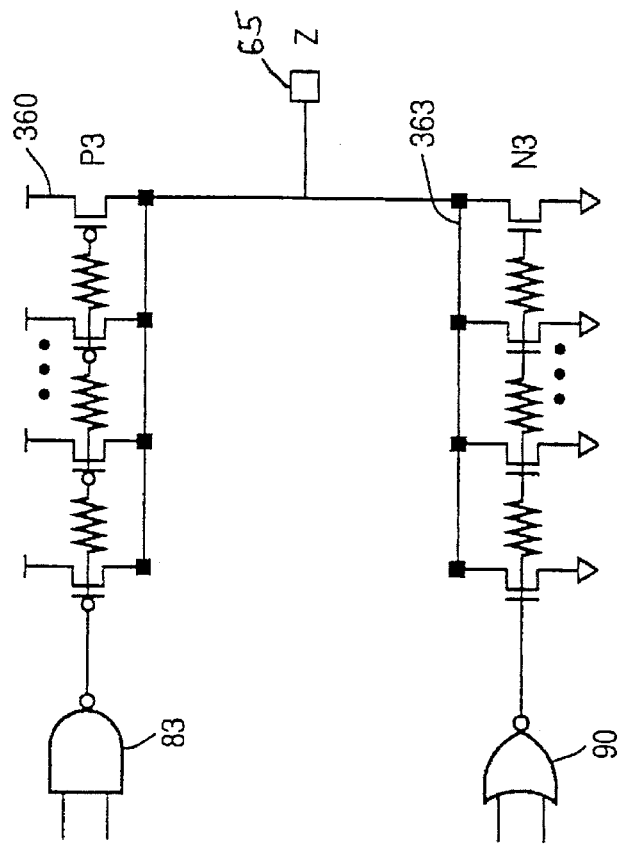
FIG. 6 is a circuit schematic of pull up device 110 and pull down device 115 of DC driver circuit 55 according to the invention.
Figure 6:
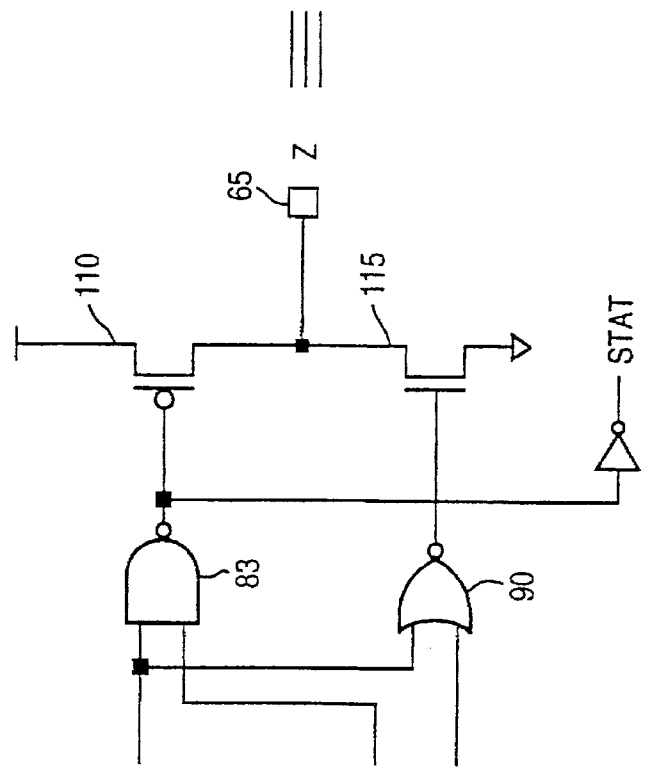

FIG. 6 is a circuit diagram of pull up device 110 and pull down device 115, which are shown as individual transistors in FIG. 3, with associated logic gates 83, and 90 of the DC driver circuit. The DC driver turns on a short time after the AC driver begins turning on and is designed to provide current sink and source capability sufficient to maintain a high or low signal at the output during the low phase of the PHA clock when the AC driver is inactive.

Transistor banks P3 makes up pull up device 110. Transistor banks N3 makes up pull down device 115.

Pull up device 110 and pull down device 115 operate in an identical fashion during an output cycle, the only difference being that device 110 handles DC output driving during a $V_{dd}$ (logic 1) output and device 115 handles DC output driving during a $V_{ss}$ (logic 0) output. The detailed operation of device 110 will now be explained.

Shortly after the start of an output cycle in which a logic 1 is being transmitted, $V_{dd}$ is transmitted to the gates of transistor bank P3 by logic gate 83, causing the P3 transistor bank to turn on fully. The gates of the P3 transistors are connected sequentially to allow for the transistors to turn on one after another rather than all at the same time. This helps to keep the change in current small and provide an additional means of slew rate control.

Conclusion

The invention has now been explained with reference to specific embodiments. Other embodiments will be apparent to those of ordinary skill in the art upon reference to this specification. It is therefore not intended that this invention be limited, except as indicated by the appended claims.

What is claimed is:

1. In an integrated circuit, an apparatus for driving digital signals through a connector for output on a signal line comprising:

a first driver circuit coupled to said connector capable of providing sink or source current able to move a voltage level on said signal line to a desired voltage when said connector is connected to said signal line, said first driver circuit being enabled during a first part of a data cycle and said first driver circuit being disabled during a last part of data cycle;

a second driver circuit coupled to said connector capable of providing sink or source current able to maintain a desired voltage level on said signal line when said connector is connected to said signal line, said second driver circuit being enabled during a last part of a data cycle when said first driver circuit is disabled during said last part of said data cycle; and a system data clock coupled to said first driver circuit and said second driver circuit for independently turning-on and turning-off said first and said second driver circuits, said system data clock enabling said first driver circuit during a first part of a data cycle and disabling said first driver circuit during a second part of said data cycle, said system data clock coincident in time with a signal used to clock data bits on said signal line.

2. The apparatus of claim 1 wherein said first driver circuit includes a connection from within a gate-coupled transistor bank within said first driver circuit for internal feedback slew rate control.

3. The apparatus of claim 1 wherein said first driver circuit comprises:

a first pull up sequentially gated transistor bank coupled to said connector;

a second pull up sequentially gated transistor bank with internal feedback slew rate control coupled to said connector;

a first pull down sequentially gated transistor bank coupled to said connector;

a second pull down sequentially gated transistor bank with internal feedback slew rate control coupled to said connector; and control circuitry coupled to said pull up and pull down transistors for turning on either said pull up or said pull down transistors in response to a data signal and timing signals.

4. The apparatus of claim 1 further comprising:
   a STAT signal coupled to said second driver circuit for indicating whether said second driver circuit is driving said signal line; and
   a SYNC signal coupled to said first driver circuit and said second driver circuit for asynchronously turning off said first driver circuit and said second driver circuit.

5. A method for transmitting a digital signal on a signal line comprising the steps of:
   driving the signal line with a first circuit capable of providing sink or source current necessary to move the signal line to the desired voltage during the first part of a transmission cycle; and
   driving the signal line with a second circuit capable of providing sink or source current necessary to maintain the voltage on said signal line at the desired voltage during the first part and second part of a transmission cycle, said transmission cycle controlled by a system data clock, said system data clock enabling said first driver circuit during a first part of a transmission cycle and disabling said first driver circuit during a second part of said transmission cycle, said system data clock synchronized to a signal used to clock data bits on said signal line.

6. A method for controlling the slew rate in a bank of sequentially gated line driving transistors comprising the steps of:
   sending an initial signal which is below the full turn-on gate voltage to the gates of said bank of line driving transistors;
   partially separately turning on transistors in said bank in a stepped fashion in response to said initial signal; and fully turning on said transistor bank in a stepped fashion in response to an internal feedback signal.

7. A method for enabling a plurality of data processing circuits to exchange data on a signal line comprising:
   providing each of said data processing circuits that need to transmit data with a first driver circuit coupled to said signal line capable of providing sink or source current to move a voltage level on said signal line to a desired voltage and a second driver circuit coupled to said signal line capable of providing sink or source current to maintain a desired voltage level on said signal line;
   providing each of said data processing circuits that need to receive data with an input latch coupled to said signal line capable of latching data on said signal line in response to, a timing signal; and
   providing a shared data clock signal to each of said data processing circuits for controlling the turning on of said first driver circuits, said second driver circuits, and for controlling said input latches, said shared data clock signal having a period nearly equal to a clock signal used to clock said exchange of data on said signal line.

8. The method according to claim 7 wherein said shared clock signal defines a first part of a data cycle and a second part of a data cycle said data cycle being a time period needed to transfer one bit of data on a single signal wire and wherein said first driver circuit is enabled during said first part of said data cycle and is disabled during said second part of said data cycle.

9. The method according to claim 8 wherein said second driver circuit is enabled during said first and said second part of said data cycle.

* * * * *